(12) United States Patent
Kumar et al.

(10) Patent No.: US 9,985,019 B2
(45) Date of Patent: May 29, 2018

(54) SEMICONDUCTOR STRUCTURE WITH HIGH-VOLTAGE AND LOW-VOLTAGE CMOS DEVICES AND METHOD FOR MANUFACTURING THE SAME

(71) Applicant: Vanguard International Semiconductor Corporation, Hsinchu (TW)

(72) Inventors: Manoj Kumar, Dhanbad (IN); Chia-Hao Lee, New Taipei (TW); Chih-Cherng Liao, Jhudong Township (TW); Jun-Wei Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 233 days.

(21) Appl. No.: 14/856,049

(22) Filed: Sep. 16, 2015

(65) Prior Publication Data

US 2017/0077091 A1    Mar. 16, 2017

(51) Int. Cl.

| H01L 27/092 | (2006.01) |
|---|---|
| H01L 29/78 | (2006.01) |
| H01L 27/088 | (2006.01) |
| H01L 21/8238 | (2006.01) |
| H01L 21/8234 | (2006.01) |

(52) U.S. Cl.
CPC .... *H01L 27/088* (2013.01); *H01L 21/823807* (2013.01); *H01L 21/823814* (2013.01); *H01L 27/0922* (2013.01); *H01L 27/0928* (2013.01); *H01L 29/7817* (2013.01); *H01L 21/823412* (2013.01); *H01L 21/823418* (2013.01); *H01L 21/823892* (2013.01); *H01L 29/7835* (2013.01)

(58) Field of Classification Search
CPC ............. H01L 27/0922; H01L 27/0928; H01L 29/7817; H01L 29/7835
See application file for complete search history.

(56) References Cited

U.S. PATENT DOCUMENTS

| 6,404,011 B2* | 6/2002 | Kim | ................. H01L 21/76264 |
|---|---|---|---|
| | | | 257/341 |
| 6,670,651 B1 | 12/2003 | Braddock | |
| 7,329,570 B2* | 2/2008 | Lee | ................. H01L 21/823814 |
| | | | 257/341 |
| 7,372,104 B2* | 5/2008 | Wu | ................. H01L 21/823814 |
| | | | 257/335 |
| 2002/0020751 A1 | 2/2002 | Matsumoto | |

(Continued)

*Primary Examiner* — Marcos D Pizarro
(74) *Attorney, Agent, or Firm* — Birch, Stewart, Kolasch & Birch, LLP

(57) ABSTRACT

A semiconductor structure includes a first high-voltage MOS device region having a first light doping region in a substrate. The conductive type of the substrate is similar to that of the first light doping region. A first well is in the substrate. The first well substantially contacts a side of the first light doping region and does not extend under the first light doping region. The conductive type of the first well is opposite that of the first light doping region. A first gate stack is disposed on a part of the first light doping region and a first well. A first heavy doping region is disposed in the first well and the first light doping region at two sides of the first gate stack. The conductive type of the first heavy doping region is opposite that of the first light doping region.

8 Claims, 4 Drawing Sheets

(56) References Cited

U.S. PATENT DOCUMENTS

| | | | | |
|---|---|---|---|---|
| 2003/0001206 | A1* | 1/2003 | Negoro | H01L 21/823857 257/336 |
| 2009/0224739 | A1* | 9/2009 | Zuniga | H01L 21/823814 323/282 |
| 2010/0270616 | A1* | 10/2010 | Yanagi | H01L 21/823814 257/343 |
| 2010/0301413 | A1* | 12/2010 | You | H01L 27/0922 257/343 |

* cited by examiner

SEMICONDUCTOR STRUCTURE WITH HIGH-VOLTAGE AND LOW-VOLTAGE CMOS DEVICES AND METHOD FOR MANUFACTURING THE SAME

BACKGROUND

Technical Field

The disclosure relates to a semiconductor structure, and in particular it relates to a semiconductor structure that simultaneously includes a low-voltage MOS device and a high-voltage MOS device and method for manufacturing the same.

Description of the Related Art

Manufacturers of electronic goods are under constant pressure to supply devices with expanded functionality and lower prices. One example is the cell phone, where staunch competition between manufacturers and re-sellers has kept cell phone prices down even as cell phone functions have expanded dramatically. Indeed, cell phones now include such capabilities as e-mail, web-browsing, text-messaging, music storage, photography, and video playback.

In order to facilitate the trend towards expanded device functionality at lower prices, manufacturers must develop not only new processing architectures and algorithms, but also new semiconductor technologies allowing denser device integration at lower fabrication costs. However, increased device integration often requires a blending of heretofore incompatible technologies into a common device substrate.

Many electronic devices, such as the cell phone, include low-voltage CMOS devices in various circuitry (e.g., data encryption and decryption). However, the same electronic devices also include relatively high-voltage devices in another circuitry (e.g., modulators/demodulators and power amplifiers). Unfortunately, high-voltage devices do not generally function effectively at low voltages, and the low-voltage devices can be damaged by high voltages. These facts often result in the conventional provision of separate integrated circuits, one implemented in low-voltage devices and another implemented in high-voltage devices. However, such an approach to dealing with the common provision of different types of devices is simply not possible under emerging pressures related to integration densities and fabrication costs.

Many skills have been developed to overcome the problems cited above. However, the conventional skills that are often needed may entail the use of photomasks and that lithography processes be conducted. Accordingly, a novel structure for reducing the number of photomasks and lithography processes is called for.

BRIEF SUMMARY

One embodiment of the disclosure provides a semiconductor structure, comprising a first high-voltage MOS device region, which includes a first light-doping region in a substrate, and the conductive type of the first light-doping region is similar to that of the substrate. A first well is disposed in the substrate to substantially contact a side of the first light-doping region without extending under the first light-doping region, wherein the conductive type of the first well is opposite that of the first light-doping region. A first gate stack is disposed on a part of the first light-doping region and a part of the first well. A plurality of first heavy-doping regions are disposed in the first well and the first light-doping region at two sides of the first gate stack, wherein the conductive type of the first heavy-doping regions is opposite that of the first light-doping region. The first light-doping region between the first well and the first heavy-doping region is a channel region of the first high-voltage MOS device region.

One embodiment of the disclosure provides a method of forming a semiconductor structure, comprising: forming a first well in a substrate, wherein the conductive type of the first well is opposite that of the substrate. The method also forms a first light-doping region in the substrate, wherein the first well substantially contacts a side of the first light-doping region and does not extend under the first light-doping region, and the conductive type of the first well is opposite that of the first light-doping region. The method also forms a first gate stack on a part of the first light-doping region and a part of the first well, and implanting dopants to the first well and the first light-doping region not covered by the first gate stack to form a plurality of first heavy-doping regions. The conductive type of the first heavy-doping regions is opposite that of the first light-doping region. The first light-doping region between the first well and the first heavy-doping region is a channel region of a first high-voltage MOS device region.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
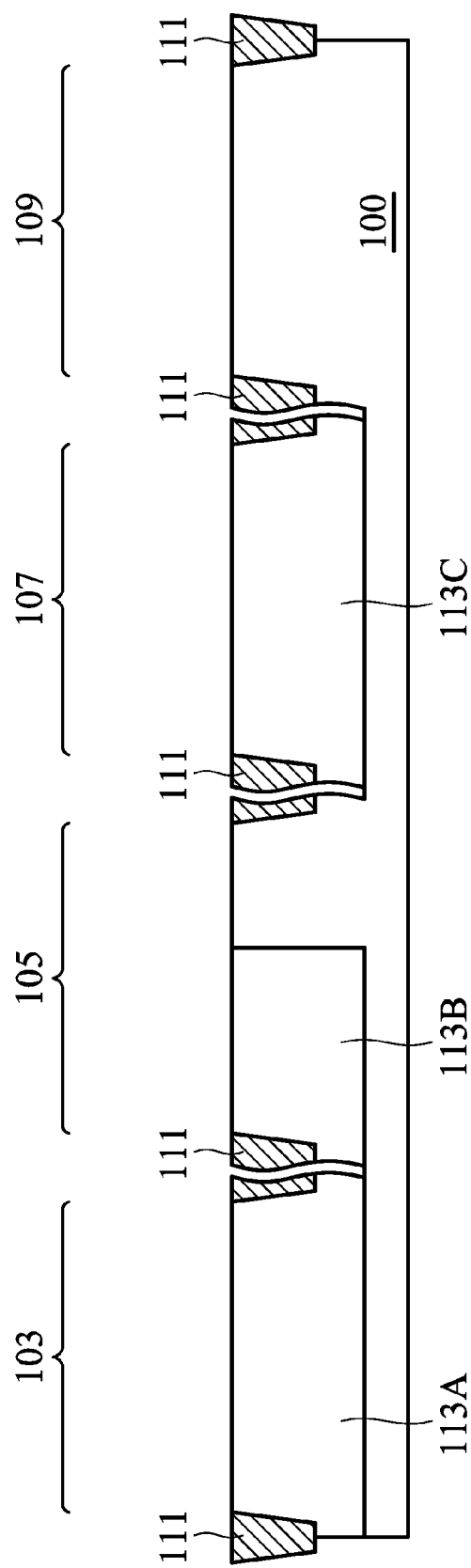
FIGS. 1, 2, 3 and 4 are cross sections of a semiconductor structure during manufacture in one embodiment.

FIGS. 1, 2, 3, and 4 are cross sections of a semiconductor structure during manufacture in one embodiment. As shown in FIG. 1, a p-type substrate 100 is provided. The substrate 100 can be silicon substrate, a silicon-on-insulator (SOI) substrate, or the like. In one embodiment, the substrate 100 is provided, and then implanted by p-type dopants. Alternatively, the substrate 100 is formed by epitaxy growth and in-situ doped by the p-type dopants. In one embodiment, the substrate 100 has a doping concentration of 7e13 atoms/cm$^3$ to 7e15 atoms/cm$^3$.

Isolation structures 111 are then formed on the substrate 100 to separate and define a plurality of device regions, e.g. a p-type high-voltage MOS device region 103, an n-type high-voltage MOS device region 105, a p-type low-voltage MOS device region 107, and an n-type low-voltage MOS device region 109. The isolation structures 111 in FIG. 1 are shallow trench isolation (STI), which can be formed by but not limited to the following steps: forming a mask layer on the substrate 100; patterning the mask layer to expose a part of the substrate 100 by lithography and etching processes; etching the exposed part of the substrate 100 to form trenches; filling the trenches with isolation material such as silica; and removing the patterned mask layer. Alternatively, the isolation structures 111 can be local oxidation of silicon (LOCOS), which can be formed by but not limited to the following steps: depositing a mask layer such as a silicon nitride layer on the substrate 100; patterning the mask layer to expose a part of the substrate 100 by lithography and etching processes; thermally oxidizing the exposed part of the substrate 100 to form a silica layer; and removing the patterned mask layer. The above silica layer is the LOCOS.

Subsequently, an n-type well 113A is formed in the high-voltage MOS device region 103, an n-type well 113B is formed in the high-voltage MOS device region 105, and an n-type well 113C is formed in the low-voltage MOS device region 107, respectively. In one embodiment, the wells 113A, 113B, and 113C can be formed by but not limited to the following steps: forming a mask pattern (not shown) to cover a part of the high-voltage MOS device region 105 and the low-voltage MOS device region 109 by lithography and etching processes; implanting n-type dopants to the high-voltage MOS device region 103, a part of the high-voltage MOS device 105, and the low-voltage MOS device region 107 to define the wells 113A, 113B, and 113C; and then removing the mask pattern. In one embodiment, the wells 113A, 113B, and 113C have the same doping concentration of 5e14 atoms/$cm^3$ to 1e17 atoms/$cm^3$. As shown in FIG. 1, the wells 113A, 113B, and 113C have the same doping depth.

Figure 2:
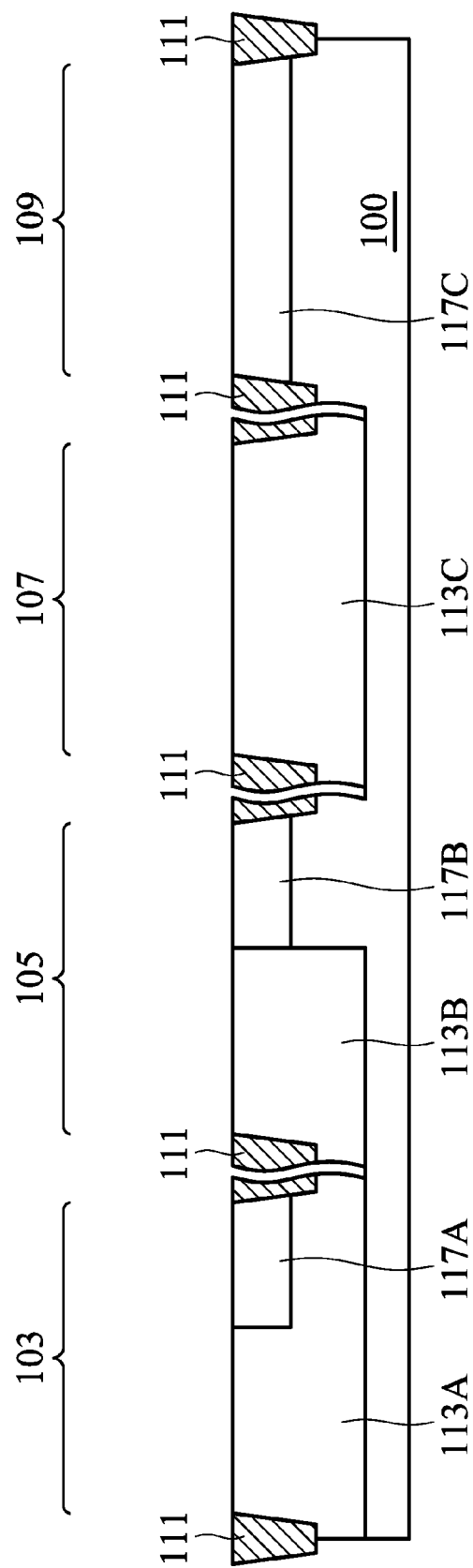

As shown in FIG. 2, a p-type light-doping region 117A is formed in a part of the well 113A, a p-type light-doping region 117B is formed in a part of the high-voltage MOS device region 105, and a p-type light-doping region 117C is formed in the low-voltage MOS device region 109. In one embodiment, the light-doping regions 117A, 117B, and 117C can be formed by but not limited to the following steps: forming a mask pattern (not shown) to cover a part of the high-voltage MOS device region 103, a part of the high-voltage MOS device region 105, and the low-voltage MOS device region 107; implanting p-type dopants into a part of the well 113A, a part of the high-voltage MOS device region 105, and the low-voltage MOS device region 109 to define the light-doping regions 117A, 117B, and 117C; and removing the mask pattern. In one embodiment, the light-doping regions 117A, 117B, and 117C have the same doping concentration of 1e15 atoms/$cm^3$ to 1e17 atoms/$cm^3$. As shown in FIG. 2, the light-doping regions 117A, 117B, and 117C have the same doping depth, which is less than the depth of the wells 113A, 113B, and 113C to avoid the leakage between source to bulk resulted from the same conductive type of the well 113A and substrate. Note that the well 113B of the high-voltage MOS device 105 only substantially contacts the side of the light-doping region 117B, but does not extend under the light-doping region 117B. If the well 113B strides over the whole high-voltage MOS device 105 (similar to the well 117A), the doping concentration of the light-doping region 117B should be increased. As a result, the doping concentration of the light-doping regions 117A and 117C will be also increased this may cause higher threshold voltage in these devices. In one embodiment, the side of the light-doping region 117B and the side of the well 113B are slightly overlapped or separated by a distance (e.g. not contact). However, the side of the light-doping region 117B substantially contacts the side of the well 113B in principle.

Figure 3:
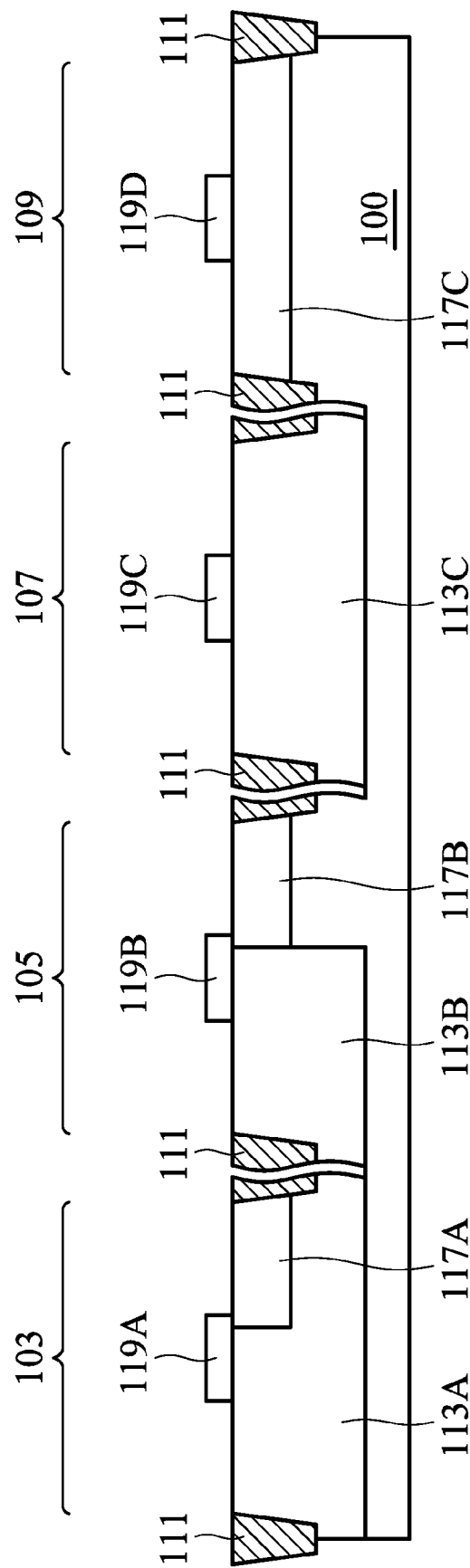

As shown in FIG. 3, gate stacks 119A, 119B, 119C, and 119D are then formed over the high-voltage MOS device region 103, the high-voltage MOS device region 105, the low-voltage MOS device region 107, and the low-voltage MOS device region 109, respectively. The gate stack 119A covers a part of the well 113A and a part of the light-doping region 117A, and the gate stack 119B covers a part of the well 113B and a part of the light-doping region 117B. In one embodiment, the gate stacks 119A, 119B, 119C, and 119D can be formed by but not limited to the following steps: forming a gate dielectric layer on the structure in FIG. 2; forming a gate electrode layer on the gate dielectric layer; forming a mask pattern (not shown) to cover a part of the gate electrode layer by lithography and etching processes; and then removing the gate electrode layer (not covered by the mask pattern) and the underlying gate dielectric layer to define the gate stacks 119A, 119B, 119C, and 119D. In one embodiment, the gate dielectric layer can be composed of silicon oxide ($SiO_2$), silicon nitride, silicon oxynitride, high-k material, any other suitable dielectric material, or a combination thereof, and the gate electrode layer can be composed of amorphous silicon, poly-silicon, one or more metal, metal nitride, conductive metal oxide, or a combination thereof.

Note that the order of FIGS. 2 and 3 can be reversed, such that the gate stacks are formed before forming the light-doping regions 117A, 117B, and 117C. If the gate stacks are formed earlier, the spacers 120 must be formed on sidewalls of the gate stacks after forming the light-doping regions 117A, 117B, and 117C, such that the subsequently formed heavy-doping region 121A and the well 113A (or the subsequently formed heavy doping region 123A and the well 113B) are separated by the light-doping region 117A (or 117B).

Figure 4:
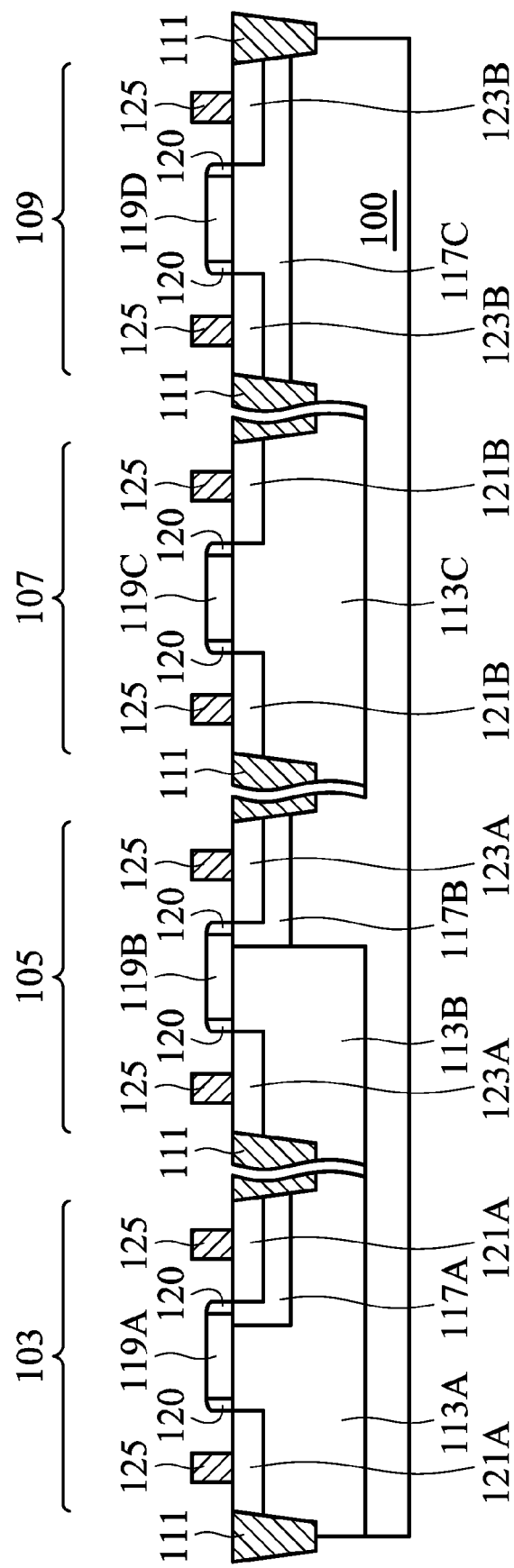

As shown in FIG. 4, spacers 120 can be optionally formed on sidewalls of the gate stacks 119A, 119B, 119C, and 119D. In one embodiment, the spacers 120 can be formed by but not limited to the following steps: forming a spacer layer on the gate stacks and the exposed doping regions; and then removing a part of the spacer layer by anisotropic etching to keep the spacers 120 on the sidewalls of the gate stacks. The spacer layer can be silica, silicon nitride, silicon oxynitride, or a multi-layered structure thereof. Alternatively, the spacers 120 can be omitted.

As shown in FIG. 4, p-type heavy-doping regions 121A are formed in the well 113A and the light-doping region 117A at two sides of the gate stack 119A, n-type heavy-doping regions 123A are formed in the well 113B and the light-doping region 117B at two sides of the gate stack 119B, p-type heavy-doping regions 121B are formed in the well 113C at two sides of the gate stack 119C, and n-type heavy-doping regions 123B are formed in the light-doping region 117C at two sides of the gate stack 119D. In one embodiment, the heavy doping regions 121A and 121B can be formed by but not limited to the following steps: forming a mask pattern (not shown) to cover the high-voltage MOS device region 105 and the low-voltage MOS device region 109 by lithography and etching processes; and implanting p-type dopants to the high-voltage MOS device region 103 and the low-voltage MOS device region 107 not covered by the gate stacks 119A and 119C for defining heavy-doping regions 121A and 121B, and removing the mask pattern. In one embodiment, the heavy doping regions 121A and 121B have the same doping concentration of 5e17 atoms/$cm^3$ to 2e20 atoms/$cm^3$. As shown in FIG. 4, the heavy doping regions 121A and 121B have the same doping depths, and the heavy-doping region 121A has a doping depth less than that of the light-doping region 117A. The p-type light-doping region 117A disposed between the n-type well 113A and the right sided heavy-doping region 121A is a drift region of the high-voltage MOS device region 103, and the n-type well 113A disposed between the p-type heavy-doping region 121A and the p-type light-doping region 117A is a channel region of the high-voltage MOS device region 103.

In the above structure, the thickness of the spacers 120 can be changed to adjust the width of the light-doping region 117A that is covered by the gate stack 119A and the spacer 120. As such, the structures in FIGS. 1 to 4 can be completed by the same photo masks and the same implanting processes, and the drift length of the high-voltage MOS device region 103 can be easily adjusted by changing the thickness of the spacers 120.

In one embodiment, the heavy doping regions 123A and 123B can be formed by but not limited to the following steps: forming a mask pattern (not shown) to cover the high-voltage MOS device region 103 and the low-voltage MOS device region 107 by lithography and etching processes; and implanting n-type dopants to the high-voltage MOS device region 105 and the low-voltage MOS device region 109 not covered by the gate stacks 119B and 119D for defining the heavy-doping regions 123A and 123B, and removing the mask pattern. In one embodiment, the heavy doping regions 123A and 123B have the same doping concentration of 1e17 atoms/cm$^3$ to 5e19 atoms/cm$^3$. As shown in FIG. 4, the heavy doping regions 123A and 123B have the same doping depths, and the heavy-doping region 123A has a doping depth less than that of the light-doping region 117B. The p-type light-doping region 117B disposed between the n-type well 113B and the right sided heavy-doping region 123A is a channel region of the high-voltage MOS device region 105. In the above structure, the thickness of the spacers 120 can be changed to adjust the width of the light-doping region 117B that is covered by the gate stack 119B and the spacer 120. As such, the structures in FIGS. 1 to 4 can be completed by the same photo masks and the same implanting processes, and the channel length of the high-voltage MOS device region 105 and corresponding driving voltage can be easily adjusted by changing the thickness of the spacers 120. In other words, the driving voltage of the high-voltage MOS device region can be easily adjusted without changing the doping concentration of the doping region or changing the photo mask design. It should be understood that the heavy-doping regions 121A and 121B can be formed before the formation of the heavy-doping regions 123A and 123B. Alternatively, the heavy-doping regions 123A and 123B can be formed before the formation of the heavy-doping regions 121A and 121B.

The n-type well 113C between the p-type heavy-doping regions 121B is a channel region of the low-voltage MOS device region 107. The p-type light-doping region 117C between the n-type heavy-doping regions 123B is a channel region of the low-voltage MOS device region 109. It should be understood that the heavy-doping regions 121A at two sides of the gate stack 119A are source/drain regions of the high-voltage MOS device region 103, the heavy-doping regions 123A at two sides of the gate stack 119B are source/drain regions of the high-voltage MOS device region 105, the heavy-doping regions 121B at two sides of the gate stack 119C are source/drain regions of the low-voltage MOS device region 107, and the heavy-doping regions 123B at two sides of the gate stack 119D are source/drain regions of the low-voltage MOS device region 109. An ILD (not shown) can then be formed on the above structure, and contacts 125 can then be formed to penetrate the ILD for contacting the heavy-doping regions 121A, 121B, 123A, and 123B.

In the above embodiment, the substrate 100, the high-voltage MOS device region 103, the low-voltage MOS device 107, the light-doping regions 117A, 117B, and 117C, and the heavy-doping regions 121A and 121B are p-type; and the high-voltage MOS device region 105, the low-voltage MOS device region 109, the wells 113A, 113B, and 113C, and the heavy doping regions 123A and 123B are n-type. Alternatively, the substrate 100, the high-voltage MOS device region 103, the low-voltage MOS device 107, the light-doping regions 117A, 117B, and 117C, and the heavy-doping regions 121A and 121B are n-type; and the high-voltage MOS device region 105, the low-voltage MOS device region 109, the wells 113A, 113B, and 113C, and the heavy doping regions 123A and 123B are p-type. It should be understood that the n-type dopants can be phosphorus, arsenic, or antimony, and the p-type dopants can be boron of $BF_2$.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a first high-voltage MOS device region, including:
      a first light-doping region in a substrate, and a conductive type of the first light-doping region is similar to that of the substrate;
      a first well disposed in the substrate to substantially contact a side of the first light-doping region without extending under the first light-doping region, wherein a conductive type of the first well is opposite that of the first light-doping region;
      a first gate stack on a part of the first light-doping region and a part of the first well; and
      a plurality of first heavy-doping regions in the first well and the first light-doping region at two sides of the first gate stack, wherein a conductive type of the first heavy-doping regions is opposite that of the first light-doping region,
   wherein the first light-doping region between the first well and the first heavy-doping region is a channel region of the first high-voltage MOS device region; and
   a second high-voltage MOS device region, including:
      a second well in the substrate, wherein a conductive type, a doping concentration, and a doping depth of the second well are similar to those of the first well;
      a third light-doping region in a part of the second well, wherein a conductive type, a doping concentration, and a doping depth of the third light-doping region are similar to those of the first light-doping region;
      a third gate stack on a part of the third light-doping region and a part of the second well; and
      a plurality of third heavy-doping regions in the second well and the third light-doping region at two sides of the third gate stack, wherein a conductive type of the third heavy-doping regions is similar to that of the first light-doping region,
   wherein the third light-doping region between the second well and the third heavy-doping region is a drift region of the second high-voltage MOS device region, and
   wherein the second well between the third heavy-doping region and the third light-doping region is a channel region of the second high-voltage MOS device region.

2. The semiconductor structure as claimed in claim 1, further comprising:
   a first low-voltage MOS device region, including:

a second light-doping region in the substrate, wherein a conductive type, a doping concentration, and a doping depth of the second light-doping region are similar to those of the first light-doping region;

a second gate stack on a part of the second light-doping region;

a plurality of second heavy-doping regions in the second light-doping region at two sides of the second gate stack, wherein a conductive type, a doping concentration, and a doping depth of the second heavy-doping region are similar to those of the first heavy-doping region.

3. The semiconductor structure as claimed in claim 1, further comprising:

a second low-voltage MOS device region, including:

a third well in the substrate, wherein a conductive type, a doping concentration, and a doping depth of the third well are similar to those of the first well;

a fourth stack on a part of the third well;

a plurality of fourth heavy-doping regions in the third well at two sides of the fourth gate stack, wherein a conductive type, a doping concentration, and a doping depth of the fourth heavy-doping regions are similar to those of the third heavy-doping region.

4. The semiconductor structure as claimed in claim 1, further comprising spacers disposed on sidewalls of the first gate stack.

5. A method of forming a semiconductor structure, comprising:

forming a first well in a substrate, wherein a conductive type of the first well is opposite that of the substrate;

forming a first light-doping region in the substrate, wherein the first well substantially contacts a side of the first light-doping region and does not extend under the first light-doping region, and a conductive type of the first well is opposite that of the first light-doping region;

forming a first gate stack on a part of the first light-doping region and a part of the first well; and implanting dopants to the first well and the first light-doping region not covered by the first gate stack to form a plurality of first heavy-doping regions, wherein a conductive type of the first heavy-doping regions is opposite that of the first light-doping region, wherein the first light-doping region between the first well and the first heavy-doping region is a channel region of a first high-voltage MOS device region;

forming a second high-voltage MOS device region, including:

forming a second well of the second high-voltage MOS device region in the substrate, wherein a conductive type, a doping concentration, and a doping depth of the second well are similar to those of the first well;

forming a third light-doping region of the second high-voltage MOS device region in a part of the second well, wherein a conductive type, a doping concentration, and a doping depth of the third light-doping region are similar to those of the first light-doping region; and forming a third gate stack of the second high-voltage MOS device region on a part of the third light-doping region and a part of the second well; and forming a plurality of third heavy-doping regions in the second well and the third light-doping region at two sides of the third gate stack, wherein a conductive type of the third heavy-doping regions is similar to that of the first light-doping region, wherein the third light-doping region between the second well and the third heavy-doping region is a drift region of the second high-voltage MOS device region, and wherein the second well between the third heavy-doping region and the third light-doping region is a channel region of a second high-voltage MOS device region.

6. The method as claimed in claim 5, wherein:

the step of forming the first light-doping region also forms a second light-doping region of a first low-voltage MOS device region in the substrate;

the step of forming the first gate stack also forms a second gate stack of the first low-voltage MOS device region on a part of the second light-doping region; and the step of forming the first heavy-doping regions also forms a plurality of second heavy-doping regions of the first low-voltage MOS device region in the second light-doping region at two sides of the second gate stack.

7. The method as claimed in claim 5, wherein:

the step of forming the first well also forms a third well of a second low-voltage MOS device in the substrate;

the step of forming the first gate stack also forms a fourth gate stack of the second low-voltage MOS device region on a part of the third well; and the step of forming the third heavy-doping regions also forms a plurality of fourth heavy-doping regions in the third well at two sides of the fourth gate stack.

8. The method as claimed in claim 5, further comprising forming spacers on sidewalls of the first gate stack.

* * * * *